United States Patent
Ohmi et al.

(10) Patent No.: US 7,582,569 B2
(45) Date of Patent: Sep. 1, 2009

(54) DISTRIBUTOR AND DISTRIBUTING METHOD, PLASMA PROCESSING SYSTEM AND METHOD, AND PROCESS FOR FABRICATING LCD

(75) Inventors: Tadahiro Ohmi, 1-17-301, Komegafukuro 2-chome, Aoba-ku, Sendai-shi, Miyagi (JP) 980-0813; Naohisa Goto, 8-1, Shiroyamate 2-chome, Hachioji-shi, Tokyo (JP) 193-0825; Nobuhiro Kuga, Kanagawa (JP); Akihiko Hiroe, Kanagawa (JP)

(73) Assignees: Tokyo Electron Limited, Tokyo (JP); Tadahiro Ohmi, Sendai-shi (JP); Naohisa Goto, Hachioji-shi (JP)

( * ) Notice: Subject to any disclaimer, the term of this patent is extended or adjusted under 35 U.S.C. 154(b) by 209 days.

(21) Appl. No.: 10/591,294

(22) PCT Filed: Mar. 10, 2004

(86) PCT No.: PCT/JP2004/003086
§ 371 (c)(1),
(2), (4) Date: Aug. 31, 2006

(87) PCT Pub. No.: WO2005/088763
PCT Pub. Date: Sep. 22, 2005

(65) Prior Publication Data
US 2007/0133919 A1    Jun. 14, 2007

(51) Int. Cl.
H01L 21/302    (2006.01)
(52) U.S. Cl. .................. 438/728; 438/710; 438/732; 156/345.42
(58) Field of Classification Search ............ 438/710, 438/712, 714, 728, 732; 156/345.42, 43, 156/345.46
See application file for complete search history.

(56) References Cited
U.S. PATENT DOCUMENTS
5,188,862 A * 2/1993 Itatani et al. ............. 427/570
(Continued)

FOREIGN PATENT DOCUMENTS
JP    7 106847    4/1995
(Continued)

OTHER PUBLICATIONS
Tsuneyama, Yasushi et al., "Circular Polarized Broadside Beam Waveguide Slot Array with a Matching Element and Stub", Proceedings of the 2003 IEICE Society Conference, vol. B-1-214, pp. 214, 2003. (With partial English translation).
(Continued)

*Primary Examiner*—Lan Vinh
(74) *Attorney, Agent, or Firm*—Oblon, Spivak, McClelland, Maier & Neustadt, P.C.

(57) ABSTRACT

A distributor (30) includes a square waveguide (31) to be connected to a microwave oscillator (20) and a square waveguide (41) having a plurality of openings (43) formed in a narrow wall (41B). The square waveguide (31) is hollow. A wave delaying member (53) having a relative dielectric constant $\in_r$ is arranged in the square waveguide (41). Narrow walls (31A, 41A) of the two square waveguides (31, 41) are brought into contact with each other, and a communication hole (32) through which the two waveguides (31, 41) communicate with each other is formed in the narrow walls (31A, 41A). The widths of the two waveguides (31, 41) do not become narrow at their connecting portion even if the width of the communication hole (32) is decreased. Thus, a band of a frequency that can pass through the connecting portion is suppressed from becoming narrow. Consequently, reflection loss that occurs when the frequency of electromagnetic waves to be input to the distributor (30) changes can be decreased.

18 Claims, 11 Drawing Sheets

U.S. PATENT DOCUMENTS

| | | | | |
|---|---|---|---|---|
| 5,265,268 | A | * | 11/1993 | Tahim ........................ 455/328 |
| 6,184,624 | B1 | * | 2/2001 | Inouchi ................. 315/111.81 |
| 6,690,702 | B1 | * | 2/2004 | Ohmi et al. .................... 372/57 |
| 2004/0250954 | A1 | * | 12/2004 | Choe et al. ............. 156/345.47 |

FOREIGN PATENT DOCUMENTS

| | | |
|---|---|---|
| JP | 2928154 | 5/1999 |
| JP | 11 274838 | 10/1999 |
| JP | 11 330812 | 11/1999 |
| JP | 2001 223098 | 8/2001 |
| JP | 2003 133232 | 5/2003 |
| JP | 2003 152441 | 5/2003 |
| JP | 2003 188152 | 7/2003 |
| JP | 2003 198242 | 7/2003 |

OTHER PUBLICATIONS

N. Marcuvitz, "Open T-Junction, II-Plane", E-Plane Junctions, Waveguide Handbook, 1951, pp. 354, 355, 356, 357, 378, 379.

J. Uher, "Waveguide Componenets for Antenna Feed Systems : Theory and CAD", Artech House, 1983, pp. 290, 291, 292, 293, 308, 309, 354, 355.

Sergey N. Shulag, et al., "Analysis of a Waveguide T-Junction With a 2D Scatterer in the Interaction Region Via Green's THEOREM Approach", International Conference on Antenna Theory and Techniques, Sep. 9-12, 2003, pp. 785-787.

* cited by examiner

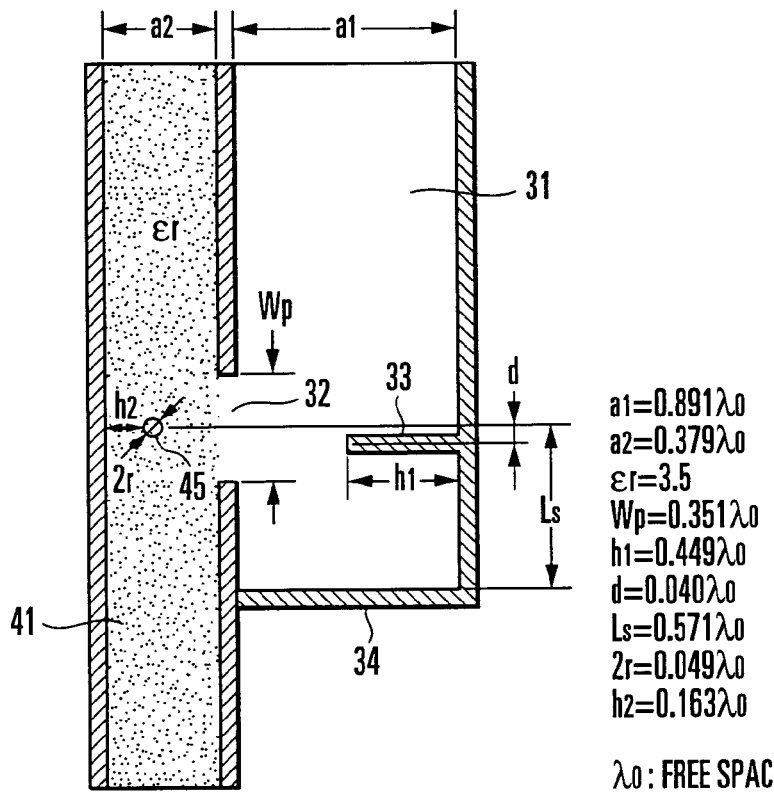
$a_1 = 0.891\lambda_0$
$a_2 = 0.379\lambda_0$
$\varepsilon_r = 3.5$
$W_p = 0.351\lambda_0$
$h_1 = 0.449\lambda_0$
$d = 0.040\lambda_0$
$L_s = 0.571\lambda_0$
$2r = 0.049\lambda_0$
$h_2 = 0.163\lambda_0$
$\lambda_0$ : FREE SPACE WAVELENGTH
F I G. 4
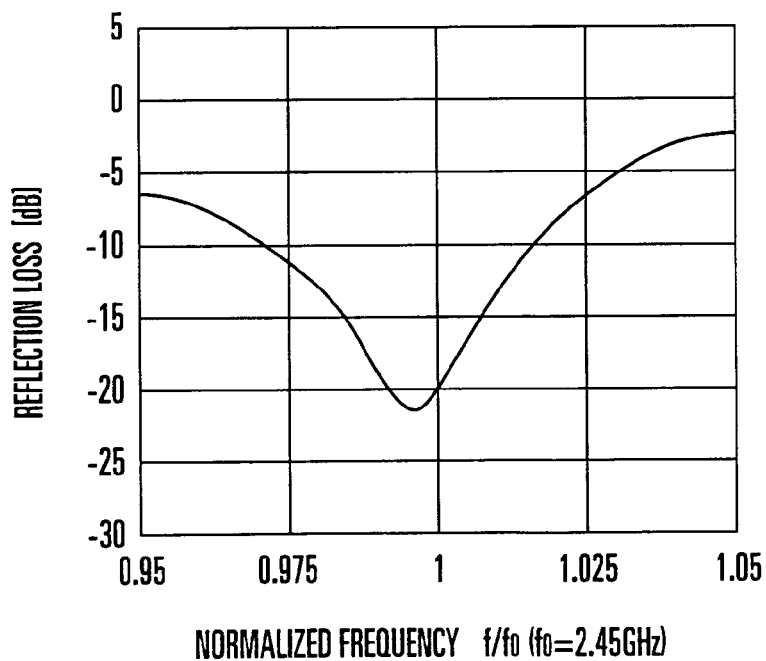
F I G. 5

DISTRIBUTOR AND DISTRIBUTING METHOD, PLASMA PROCESSING SYSTEM AND METHOD, AND PROCESS FOR FABRICATING LCD

TECHNICAL FIELD

The present invention relates to a distributor and plasma processing system and, more particularly, to an electromagnetic wave distributor which uses two square waveguides, and a plasma processing system which uses the distributor.

BACKGROUND ART

In the manufacture of a flat panel display such as an LCD (liquid crystal display) and a semiconductor device, plasma processing systems are widely used to perform processes such as etching, ashing, and CVD (Chemical Vapour Deposition). Among the plasma processing systems, a microwave plasma processing system is available which supplies microwaves into a processing vessel to ionize, excite, or dissociate a gas in the processing vessel, thus generating a plasma.

FIG. 11 is a longitudinal sectional view showing the overall arrangement of a conventional plasma processing system. This plasma processing system has a bottomed cylindrical processing vessel 1 which is square when seen from the top. The processing vessel 1 is made of a metal such as Al. A stage 2 is disposed at the central portion of the bottom surface of the processing vessel 1. An LCD substrate 3 or the like is arranged as a target object on the upper surface of the stage 2. The stage 2 is connected to a high-frequency power supply 5 through a matching box 4.

Exhaust ports 6 for vacuum evacuation are formed in the peripheral portion of the bottom surface of the processing vessel 1. A gas introduction port 7 through which a gas is introduced is formed in the side wall of the processing vessel 1. When the plasma processing system is to be used as an etching system, a plasma gas such as Ar and a reaction gas such as $CF_4$ are introduced.

The upper opening of the processing vessel 1 is closed with a dielectric plate 8 made of silica glass or the like, so the reduced pressure in the processing vessel 1 is maintained while introducing microwaves through the upper opening. An O-ring is interposed between the upper surface of the side wall of the processing vessel 1 and the dielectric plate 8 to ensure hermeticity in the processing vessel 1.

A microwave supply device 110 which supplies microwaves into the processing vessel 1 is arranged above the dielectric plate 8.

FIG. 12 is a cross-sectional view showing the arrangement of the conventional microwave supply device 110. The microwave supply device 110 comprises a microwave oscillator 120, microwave distributor 130, and antenna assembly 150.

The antenna assembly 150 has a plurality of radiation waveguides 151A, 151B, 151C, 151D, 151E, and 151F. Each of the radiation waveguides 151A to 151F is formed of a square waveguide. A square waveguide is a waveguide whose section perpendicular to its axis is rectangular, and can transmit microwaves with a transmission mode $TE_{10}$. With the transmission mode $TE_{10}$, a magnetic field is formed parallel to the tube wall, i.e., the wide wall, including the long side of the section, and an electric field is formed parallel to the tube wall, i.e., the narrow wall, including the short side of the section. A plurality of radiation slots 152 are formed in the wide wall of each of the radiation waveguides 151A to 151F. Microwaves input to each of the radiation waveguides 151A to 151F are radiated into the processing vessel 1 through the radiation slots 152 and used to generate a plasma.

A wave delaying member 153 made of a dielectric (with a relative dielectric constant $\in_r (>1)$) is arranged in each of the radiation waveguides 151A to 151F. This renders a tube wavelength $\lambda_g$ to $1/(\in_r)^{1/2}$, so that the distance among the radiation slots 152 which is set on the basis of the tube wavelength $\lambda_g$ is shortened to uniform the distribution of the plasma density.

The microwave distributor 130 has a square microwave waveguide 131 and square feeding waveguide 141 and distributes the microwaves input from the microwave oscillator 120 to the radiation waveguides 151A to 151F of the antenna assembly 150. The input end of the microwave waveguide 131 is connected to the microwave oscillator 120, and its output end is connected to the central portion of one narrow wall 141A of the feeding waveguide 141. A communication hole 132 through which the two microwave waveguides 131 and 141 communicate with each other is formed at the central portion of the narrow wall 141A (for example, see Masamitsu Nakajima, "Microwave Engineering", Morikita Shuppan, p. 132). A plurality of openings 143 through which the feeding waveguide 141 communicates with the radiation waveguides 151A to 151F are formed in the other narrow wall 141B of the feeding waveguide 141.

If some openings 143 oppose, even partly, the communication hole 132 which allows communication with the microwave waveguide 131, the microwaves to be output to the radiation waveguides through the openings 143 increase, and distribution of the microwaves among the radiation waveguides 151A to 151F becomes nonuniform. Irises 147A and 147B are formed at the connecting portion of the microwave waveguide 131 and feeding waveguide 141 to narrow the width of the communication hole 132 to be smaller than the tube width of the microwave waveguide 131 so as not to make the communication hole 132 which allows communication with the microwave waveguide 131 oppose the openings 143 which allow communication with the radiation waveguides 151A to 151F.

The interior of the microwave waveguide 131 is hollow, and the wave delaying member 153 is arranged in the feeding waveguide 141.

As described above, in the conventional plasma processing system, since the irises 147A and 147B are formed at the connecting portion of the microwave waveguide 131 and feeding waveguide 141, the tube width is narrow at the connecting portion, and the band of the frequency that can pass through the connecting portion becomes narrow. In particular, as in a case wherein the hollow microwave waveguide 131 is to be connected to the feeding waveguide 141 in which the wave delaying member 153 is arranged, the larger the difference in relative dielectric constant in the tube, the more typical the narrowing tendency of the frequency band becomes. Therefore, when the oscillation frequency of the microwave oscillator 120 changes only slightly, power that cannot pass through the connecting portion of the two waveguides 131 and 141 but is reflected increases. Thus, reflection loss in the microwave distributor 130 comprising the waveguides 131 and 141 increases.

DISCLOSURE OF INVENTION

The present invention has been made to solve the above problems, and has as its object to decrease reflection loss that occurs when the frequency of electromagnetic waves such as microwaves to be input to the distributor changes.

In order to achieve the above object, according to the present invention, there is provided a distributor characterized by comprising an oscillator which outputs electromagnetic waves, a first square waveguide to be connected to the oscillator, and a second square waveguide having a plurality of openings, wherein the first square waveguide and the second square waveguide communicate with each other through a communication hole formed in one narrow wall of each of the first square waveguide and the second square waveguide.

According to the present invention, there is also provided a plasma processing system characterized by comprising a stage to place a target object thereon, a processing vessel to accommodate the stage, an antenna assembly having a plurality of radiation waveguides with slots, and a demultiplexer which distributes electromagnetic waves to the radiation waveguides, the demultiplexer comprising an oscillator which outputs the electromagnetic waves, a first square waveguide to be connected to the oscillator, and a second square waveguide to be connected to one end of each of the radiation waveguides through a plurality of openings formed therein, wherein the first square waveguide and the second square waveguide communicate with each other through a communication hole formed in one narrow wall of each of the first square waveguide and the second square waveguide.

According to the present invention, there is also provided a distributing method characterized by comprising the steps of introducing electromagnetic waves propagating in a first square waveguide into a second square waveguide through a communication hole formed in one narrow wall of each of the first square waveguide and the second square waveguide, and distributing the electromagnetic waves introduced into the second square waveguide to a plurality of waveguides through a plurality of openings formed in the second square waveguide.

According to the present invention, there is also provided a plasma processing method characterized by comprising the steps of introducing electromagnetic waves propagating in a first square waveguide into a second square waveguide through a communication hole formed in one narrow wall of each of the first square waveguide and the second square waveguide, distributing the electromagnetic waves introduced into the second square waveguide to a plurality of radiation waveguides through a plurality of openings formed in the second square waveguide, supplying the electromagnetic waves introduced into the radiation waveguides to a processing vessel through a slot formed in each of the radiation waveguides, and processing a target object placed in the processing vessel utilizing a plasma which is generated by the electromagnetic waves supplied to the processing vessel.

According to the present invention, there is also provided a process for fabricating an LCD, characterized by comprising the steps of introducing electromagnetic waves propagating in a first square waveguide into a second square waveguide through a communication hole formed in one narrow wall of each of the first square waveguide and the second square waveguide, distributing the electromagnetic waves introduced into the second square waveguide to a plurality of radiation waveguides through a plurality of openings formed in the second square waveguide, supplying the electromagnetic waves introduced into the radiation waveguides to a processing vessel through a slot formed in each of the radiation waveguides, and subjecting a surface of an LCD substrate arranged in the processing vessel to a process such as etching, ashing, oxidation, nitridation, or CVD utilizing a plasma which is generated by the electromagnetic waves supplied to the processing vessel.

BRIEF DESCRIPTION OF DRAWINGS

FIG. 4 is a view showing the sizes of respective portions employed for numerical analysis of a connection structure;

FIG. 5 is a graph concerning reflection loss of the connection structure;

BEST MODE FOR CARRYING OUT THE INVENTION

Figure 11:
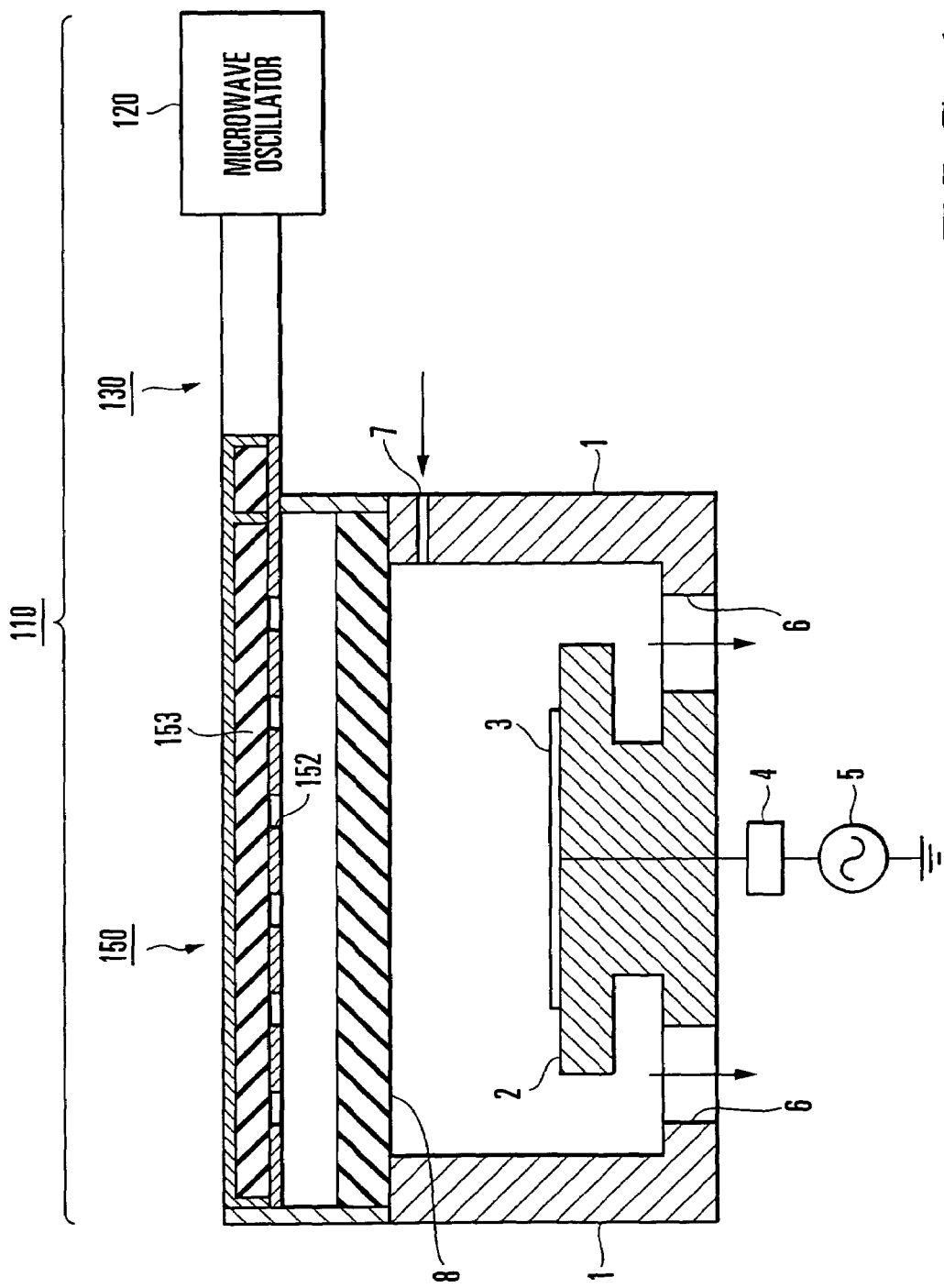
FIG. 11 is a longitudinal sectional view showing the overall arrangement of a conventional plasma processing system.
Figure 12:
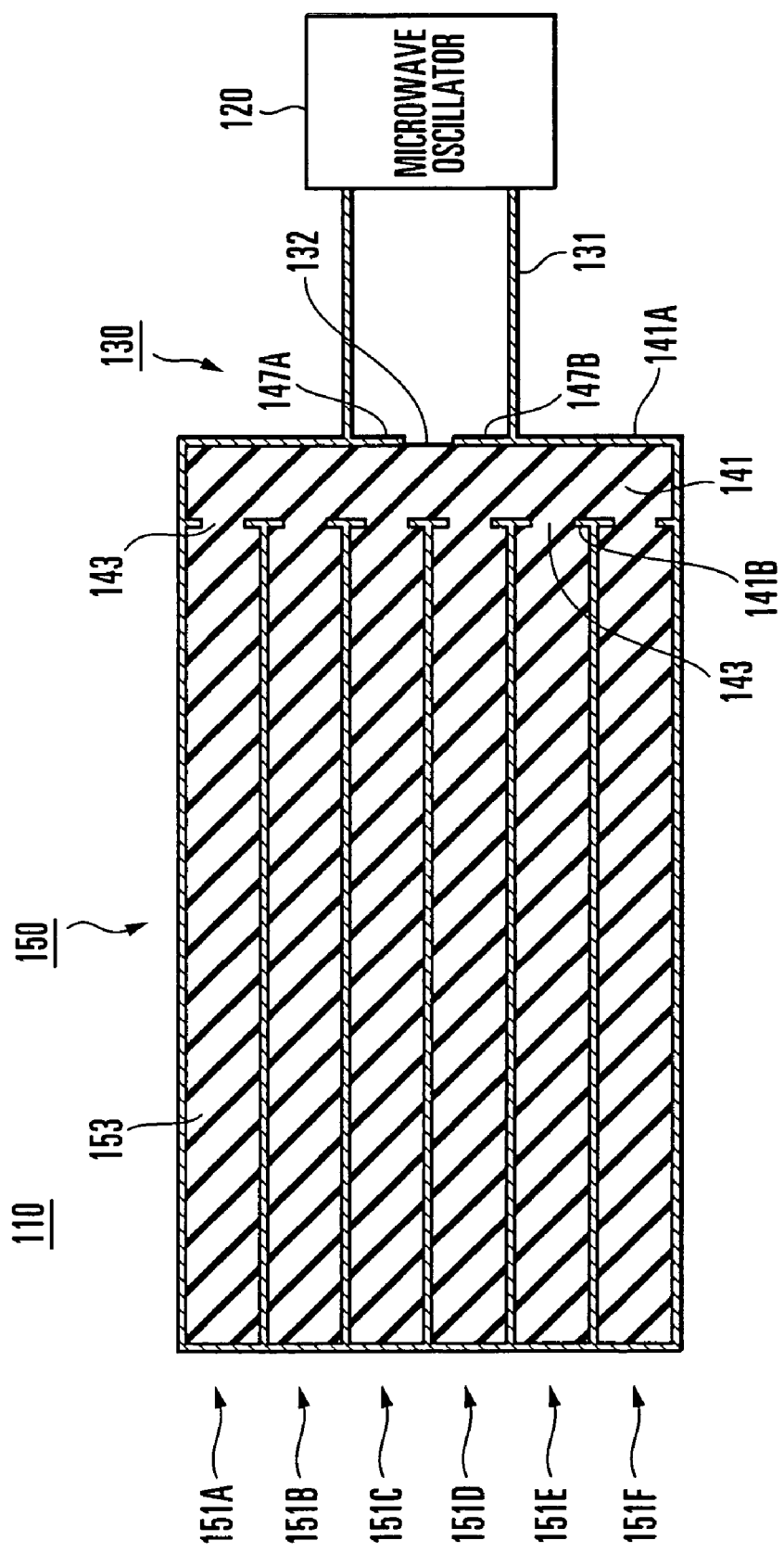
FIG. 12 is a cross-sectional view showing the arrangement of the conventional plasma processing system.

The embodiments of the present invention will be described in detail with reference to the accompanying drawings. In the following drawings, constituent elements that correspond to those shown in FIGS. 11 and 12 are denoted by the same reference numerals as in FIGS. 11 and 12, and a description thereof will be omitted when appropriate.

First Embodiment

Figure 1:
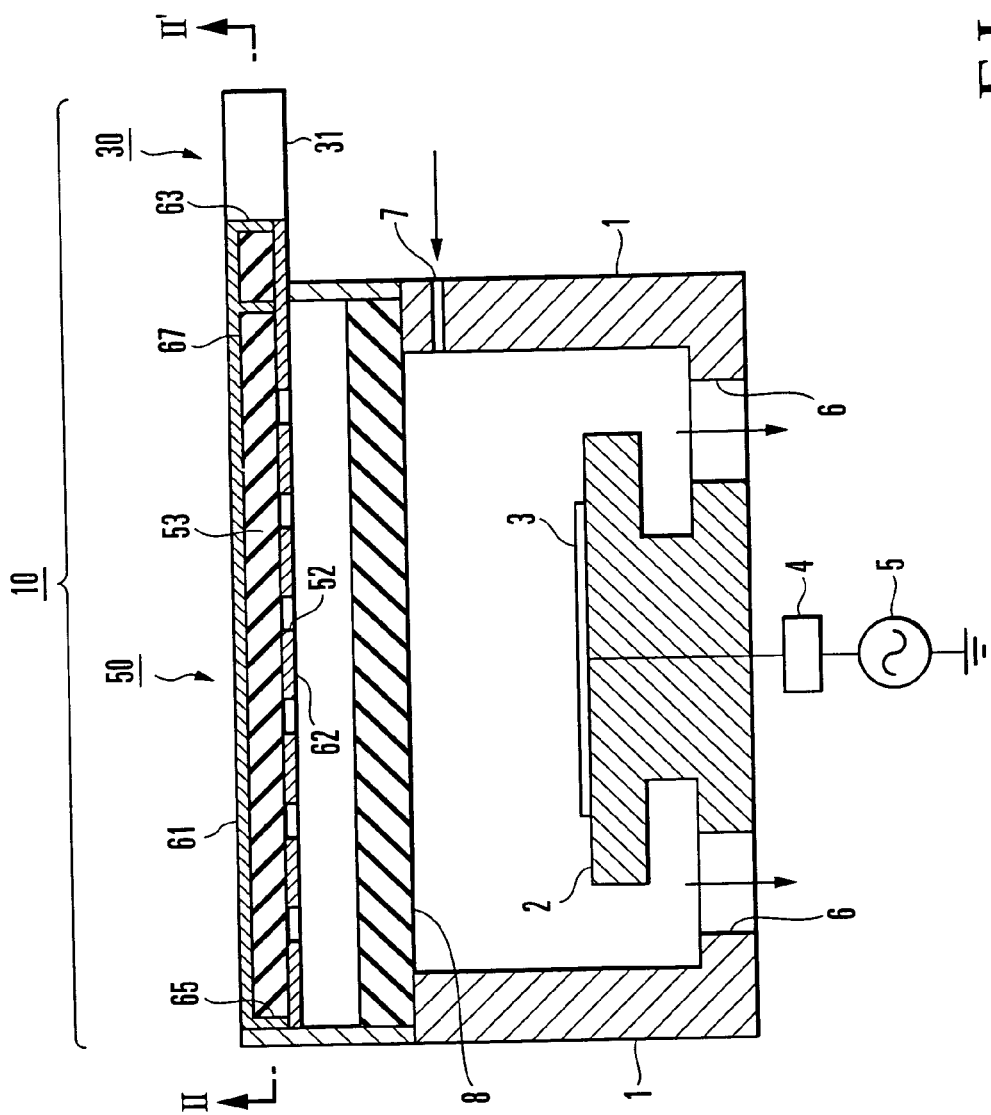
FIG. 1 is a longitudinal sectional view showing the overall arrangement of a plasma processing system according to the first embodiment.

FIG. 1 is a longitudinal sectional view showing the overall arrangement of a plasma processing system according to the first embodiment of the present invention. This plasma processing system has a stage 2 on which an LCD substrate 3 or the like is to be placed as a target object, a bottomed cylindrical processing vessel 1 which accommodates the stage 2 and is square when seen from the top, a dielectric plate 8 which closes the upper opening of the processing vessel 1, and a microwave supply device 10 which supplies microwaves as electromagnetic waves into the processing vessel 1 from outside through the dielectric plate 8.

Figure 2:
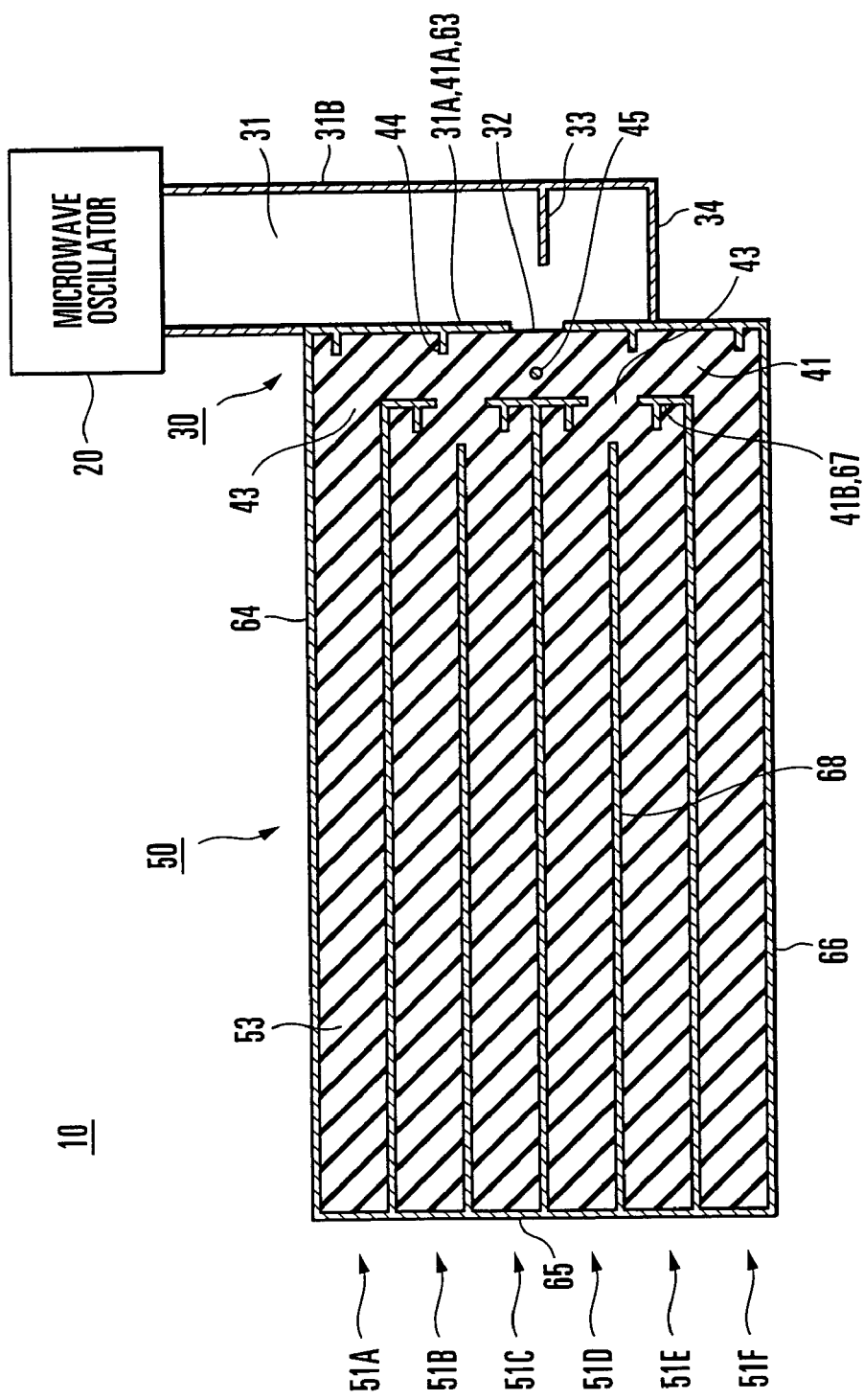
FIG. 2 is a cross-sectional view showing the arrangement of a microwave supply device.
Figure 3:
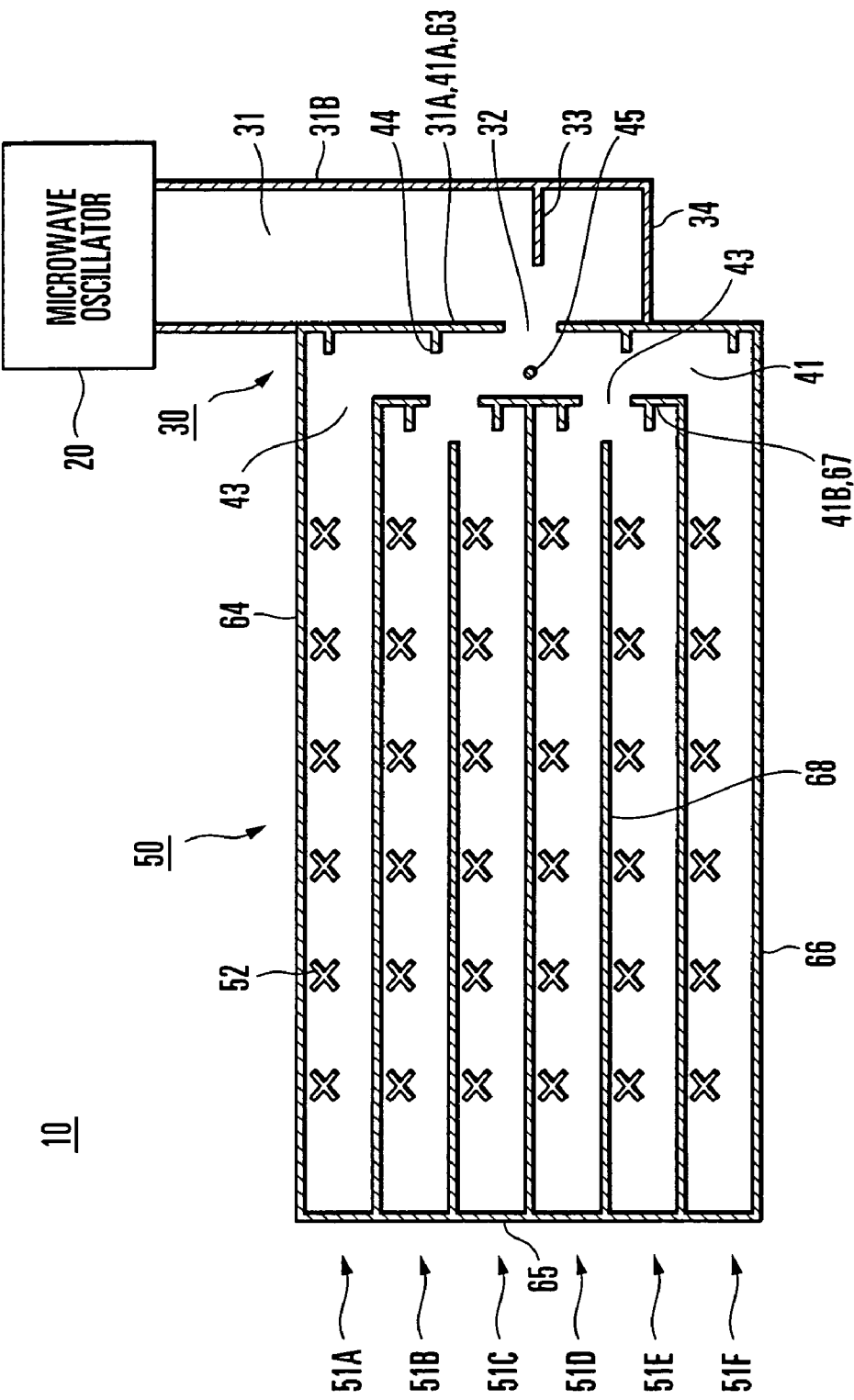
FIG. 3 is a cross-sectional view showing the arrangement of the microwave supply device.

FIGS. 2 and 3 are cross-sectional views showing the arrangement of the microwave supply device 10. FIG. 2 shows a section taken along the direction of the line II-II' of FIG. 1, and FIG. 3 shows an arrangement obtained by removing a wave delaying member 53 from FIG. 2. Some constituent elements are indicated as functional blocks.

The microwave supply device 10 comprises a microwave oscillator 20, microwave distributor 30, and antenna assembly 50.

The microwave oscillator 20 is an oscillator which outputs microwaves having a frequency of, e.g., 2.45 GHz, and is formed of, e.g., a magnetron.

The microwave distributor 30 distributes the microwaves input from the microwave oscillator 20 to a plurality of radiation waveguides 51A, 51B, 51C, 51D, 51E, and 51F of the antenna assembly 50. The distribution arrangement will be described in detail later.

Each of the radiation waveguides 51A to 51F of the antenna assembly 50 is formed of a square waveguide. The input end (one end) of each square waveguide is connected to the microwave distributor 30, and its terminal end (other end) is short-circuited. A plurality of radiation slots 52 are formed in the wide wall (H-surface) of each square waveguide. As an example of the radiation slots 52, cross slots as shown in FIG. 3 are employed. A cross slot is formed by perpendicularly crossing a pair of two slots at their centers to radiate circular polarized waves. The cross slots are arranged with an interval substantially a natural number multiple of a tube wavelength $\lambda_g$. As shown in FIG. 2, the wave delaying member 53 made of a dielectric (with a relative dielectric constant $\in_r$ (>1)) is arranged in each of the radiation waveguides 51A to 51F. The radiation waveguides 51A to 51F are arrayed in a widthwise direction perpendicular to the tube axes (the traveling direction of the microwaves) with their wide walls having the radiation slots 52 opposing the stage 2.

In the plasma processing system having the above arrangement, the microwaves output from the microwave oscillator 20 are distributed to the radiation waveguides 51A to 51F of the antenna assembly 50 by the microwave distributor 30. The microwaves introduced from the input ends of the radiation waveguides 51A to 51F are gradually radiated through the plurality of radiation slots 52 formed in the wide walls while propagating toward the terminal ends, and are transmitted through the dielectric plate 8 and supplied into the processing vessel 1. The electric field of the microwaves supplied into the processing vessel 1 accelerates electrons to ionize, excite, and dissociate the gas in the processing vessel 1, thus generating a plasma. With the plasma, the surface of the LCD substrate 3 on the stage 2 is subjected to processes such as etching, ashing, oxidation, nitridation, and CVD.

The arrangement of the microwave distributor 30 will be further described. The microwave distributor 30 has a microwave waveguide 31 formed of the first square waveguide which guides the microwaves input from the microwave oscillator 20, and a feeding waveguide 41 formed of the second square waveguide which distributes the microwaves introduced from the microwave waveguide 31 to the radiation waveguides 51A to 51F.

The input end (one end) of the microwave waveguide 31 is connected to the microwave oscillator 20, and its terminal end (other end) 34 is short-circuited.

The microwave waveguide 31 and feeding waveguide 41 are arranged parallel to each other such that one narrow wall (E-surface) 31A of the microwave waveguide 31 opposes one narrow wall (E-surface) 41A of the feeding waveguide 41. Desirably, the narrow walls 31A and 41A are in contact with each other, or formed of one conductive plate 63, as shown in FIGS. 2 and 3. A communication hole 32 is formed in the narrow walls 31A and 41A to allow the two microwave waveguide 31 and 41 to communicate with each other. Although the communication hole 32 is substantially rectangular, it may have another shape. According to this embodiment, the communication hole 32 is located at the central portion of the narrow wall 41A of the feeding waveguide 41. The microwaves propagating in the microwave waveguide 31 are introduced into the feeding waveguide 41 through the communication hole 32.

The two ends of the feeding waveguide 41 are short-circuited. A plurality of openings 43 which allow the feeding waveguide 41 to communicate with the radiation waveguides 51A to 51F are formed in the other narrow wall 41B which opposes the narrow wall 41A formed with the communication hole 32. The microwaves introduced into the feeding waveguide 41 are distributed to the radiation waveguides 51A to 51F through the openings 43. The widths of the openings 43 are adjusted so that the microwaves are distributed evenly. The width of the communication hole 32 is adjusted so the openings 43 will not oppose the communication hole 32.

As a result, even if the width of the communication hole 32 decreases, since the communication hole 32 is formed in each of the narrow wall 31A of the microwave waveguide 31 and the narrow wall 41A of the feeding waveguide 41, as described above, the widths of the two waveguides 31 and 41 do not decrease at their connecting portion, so that the band of the frequency that can pass through the connecting portion can be suppressed from becoming narrow. Hence, power that cannot pass through the connecting portion but is reflected when the frequency of the microwave changes can be decreased, and the reflection loss of the microwave distributor 30 can be decreased.

According to this embodiment, the microwave waveguide 31 is hollow, while the wave delaying member 53 is arranged in the feeding waveguide 41, in the same manner as in the radiation waveguides 51A to 51F, so the relative dielectric constants in the two waveguides 31 and 41 are different from each other. Even in this case, if the communication hole 32 is formed in the narrow walls 31A and 41A of the two waveguides 31 and 41, the reflection loss in the microwave distributor 30 can be decreased.

In the microwave distributor 30, a guide wall 33 is arranged in the microwave waveguide 31 to project from the other narrow wall 31B of the microwave waveguide 31 toward the communication hole 32. The guide wall 33 extends between the upper and lower wide walls of the microwave waveguide 31. If the guide wall 33 perpendicularly projects from the narrow wall 31B toward substantially the central portion of the communication hole 32, its projecting length hi may be set to substantially about ½ a tube wavelength $\lambda_{g0}$ of the microwave waveguide 31. When the guide wall 33 is arranged to guide the microwaves propagating in the microwave waveguide 31 toward the communication hole 32, the microwaves are readily introduced into the feeding waveguide 41 through the communication hole 32.

When the guide wall 33 is arranged, however, it reflects the microwaves to generate reflected waves that travel in the opposite direction in the microwave waveguide 31. Hence, the reflected waves are canceled by reflected waves reflected by the terminal end 34 of the microwave waveguide 31. For example, the guide wall 33 is formed at a position near the front surface of the communication hole 32, and the terminal end 34 is positioned at a position remote from the guide wall 33 by about an integer multiple of substantially ½ the tube wavelength $\lambda_g$. This can suppress reflection at the connecting portion of the microwave waveguide 31 and feeding waveguide 41 to further decrease the reflection loss of the microwave distributor 30.

In the feeding waveguide 41, a conductive column 45 is arranged in the vicinity of the central portion of the communication hole 32. The conductive column 45 extends between the upper and lower wide walls of the feeding waveguide 41.

The diameter, position, and the like of the conductive column 45 can adjust the proportion at which the microwaves introduced into the feeding waveguide 41 through the communication hole 32 are distributed to one or the other end side of the feeding waveguide. Also, the microwaves introduced into the feeding waveguide 41 can be suppressed from being reflected to return to the microwave waveguide 31. As a result, the reflection loss of the microwave distributor 30 can be further decreased.

In the feeding waveguide 41, a plurality of guide walls 44 are arranged to project from the narrow wall 41A toward the respective openings 43. The guide walls 44 extend between the upper and lower wide walls of the feeding waveguide 41. When the guide walls 44 are arranged to guide the microwaves propagating in the feeding waveguide 41 toward the openings 43, the microwaves can be readily introduced into the radiation waveguides 51A to 51F through the openings 43. Hence, the microwaves can be efficiently supplied from the microwave distributor 30 to the radiation waveguides 51A to 51F.

In the microwave distributor 30 having the above arrangement, the sizes of the respective portions were set as shown in FIG. 4. Numerical analysis was conducted on reflection loss that occurred when the microwaves were supplied from the microwave waveguide 31 to the feeding waveguide 41. As a result, a graph as shown in FIG. 5 was obtained. More specifically, with a center frequency $f_0=2.45$ GHz, the reflection loss was −20 dB, and the relative bandwidth where the reflection loss was −15 dB or loss was 2.3%. Hence, narrowing of the frequency band was suppressed.

Therefore, when the microwave distributor 30 is used, reflection of the microwave distributor 30 that occurs when the microwave frequency changes can be suppressed, and the microwaves can be efficiently supplied to the radiation waveguides 51A to 51F. Consequently, the microwaves can be supplied into the processing vessel 1 efficiently, and a process which uses the plasma generated by the microwaves can be performed efficiently.

According to this embodiment, the feeding waveguide 41 and radiation waveguides 51A to 51F are formed by partitioning the interior of a box, which is formed of two flat plates 61 and 62 which are square when seen from the top and arranged parallel to each other to be spaced apart from each other and the side wall 63 and side walls 64, 65, and 66 which connect the peripheral portions of the flat plates 61 and 62, with a partition plate 67 which is disposed at a position remote from the side wall 63 by substantially $\lambda_g/2$ to be parallel to the side walls 63 and 65, and partitioning the region sandwiched by the partition plate 67 and side wall 65 with five partition plates 68 disposed parallel to the side walls 64 and 66. The flat plates 61 and 62, side walls 63 to 66, and partition plates 67 and 68 are made of a conductor such as copper.

In this case, the flat plates 61 and 62 respectively form the wide walls of the feeding waveguide 41 and radiation waveguides 51A to 51F. The side wall 63 forms one narrow wall 41A of the feeding waveguide 41. The partition plate 67 forms the other narrow wall 41B of the feeding waveguide 41. The side wall 65 forms the terminal end surfaces of the radiation waveguides 51A to 51F. Part of the side wall 64 and part of the side wall 66 form two end faces of the feeding waveguide 41. The remaining portions of the side walls 64 and 66 and the partition plates 68 form the narrow walls of the radiation waveguides 51A to 51F. The communication hole 32 is formed at the central portion of the side wall 63, and the plurality of openings 43 are formed in the partition plate 67. The plurality of radiation slots 52 are formed in the flat plate 62 which opposes the stage 2.

Second Embodiment

Figure 6:
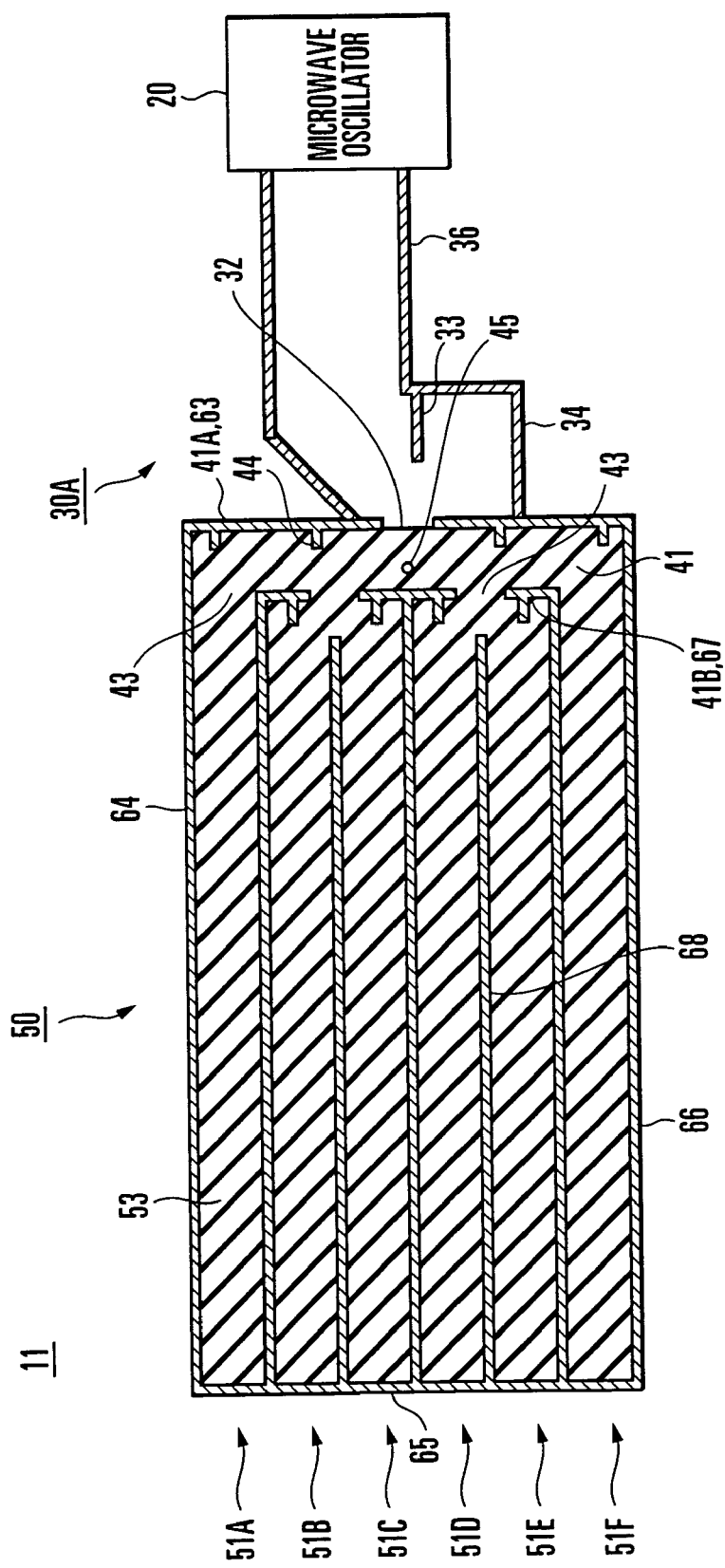
FIG. 6 is a cross-sectional view showing the arrangement of a microwave supply device according to the second embodiment.

FIG. 6 is a cross-sectional view showing the arrangement of a microwave supply device according to the second embodiment of the present invention. A microwave distributor 30A of this microwave supply device 11 employs a microwave waveguide 36 which is L-shaped when seen from the top. The remaining portion of the microwave distributor 30A is identical to the microwave distributor 30 of the first embodiment. More specifically, a communication hole 32 through which the microwave waveguide 36 communicates a feeding waveguide 41, a guide wall 33 in the microwave waveguide 36, a terminal end 34 of the microwave waveguide 36, and a conductive column 45 in the feeding waveguide 41 are arranged in the same manner as in the first embodiment. Thus, the reflection loss of the microwave distributor 30, that occurs when the microwave frequency changes, can be decreased in the same manner as in the first embodiment.

Third Embodiment

Figure 7:
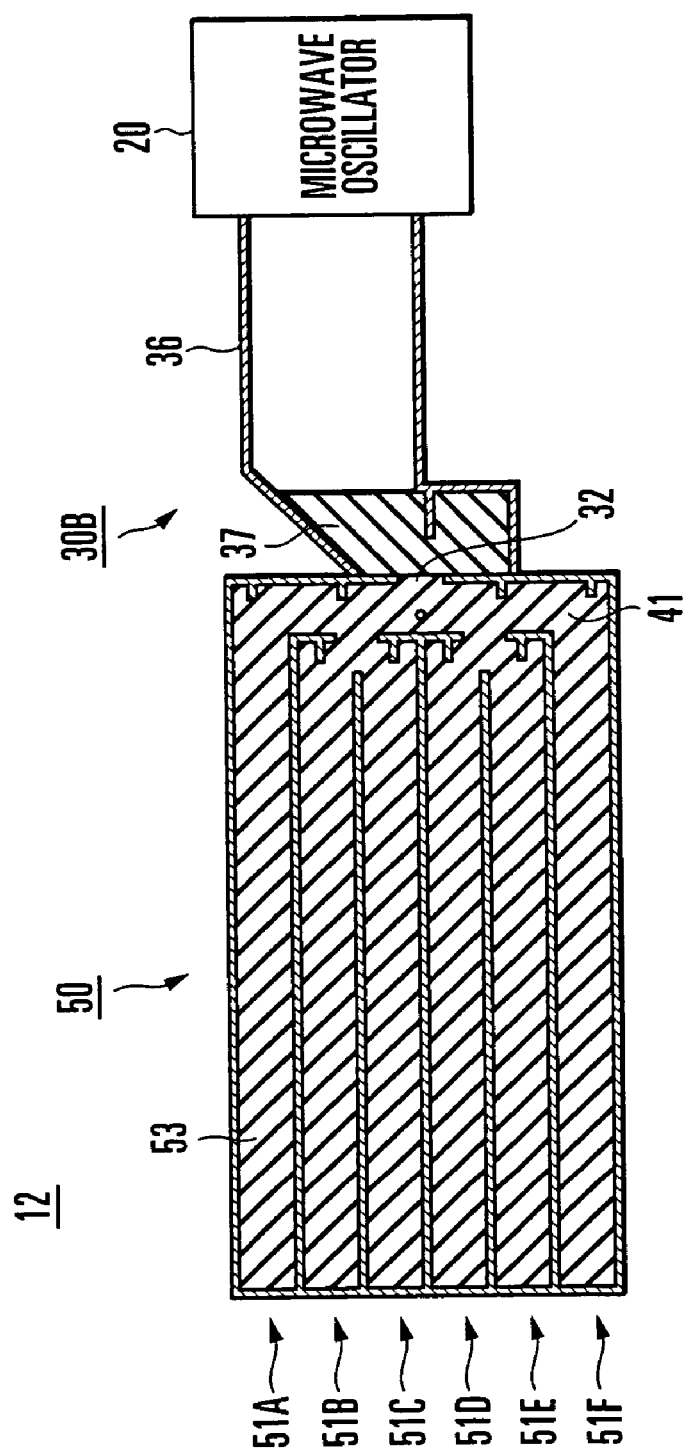
FIG. 7 is a cross-sectional view showing the arrangement of a microwave supply device according to the third embodiment.

FIG. 7 is a cross-sectional view showing the arrangement of a microwave supply device according to the third embodiment of the present invention. In this microwave supply device 12, a wave delaying member 53 made of a dielectric such as alumina having a comparatively high relative dielectric constant is arranged in radiation waveguides 51A to 51F and feeding waveguide 41 to shorten the distance among radiation slots 52. In that region in a microwave waveguide 36 which is close to a communication hole 32, a wave delaying member 37 made of a dielectric such as quartz having a relative dielectric constant lower than that of the wave delaying member 53 is arranged. A region in the microwave waveguide 36 which is away from the communication hole 32 is left hollow.

The band of the frequency that can pass through the connecting portion of the microwave waveguide 36 and feeding waveguide 41 tends to become narrow as a change in relative dielectric constant at the connecting portion increases. When the relative dielectric constant of that region in the microwave waveguide 36 which is close to the communication hole 32 is set to a value between the relative dielectric constant of the region away from the communication hole 32 and that in the feeding waveguide 41, a change in relative dielectric constant at the connecting portion of the two waveguides 31 and 41 can be moderated, so the band narrowing of the frequency that can pass through the connecting portion can be suppressed. As a result, power that cannot pass through the connecting portion but is reflected when the microwave frequency changes can be decreased, so the reflection loss of a microwave distributor 30B can be decreased.

Alternatively, three or more types of wave delaying members may be employed, so the relative dielectric constant in the microwave waveguide 36 and feeding waveguide 41 changes with three levels or more.

Fourth Embodiment

Figure 8:
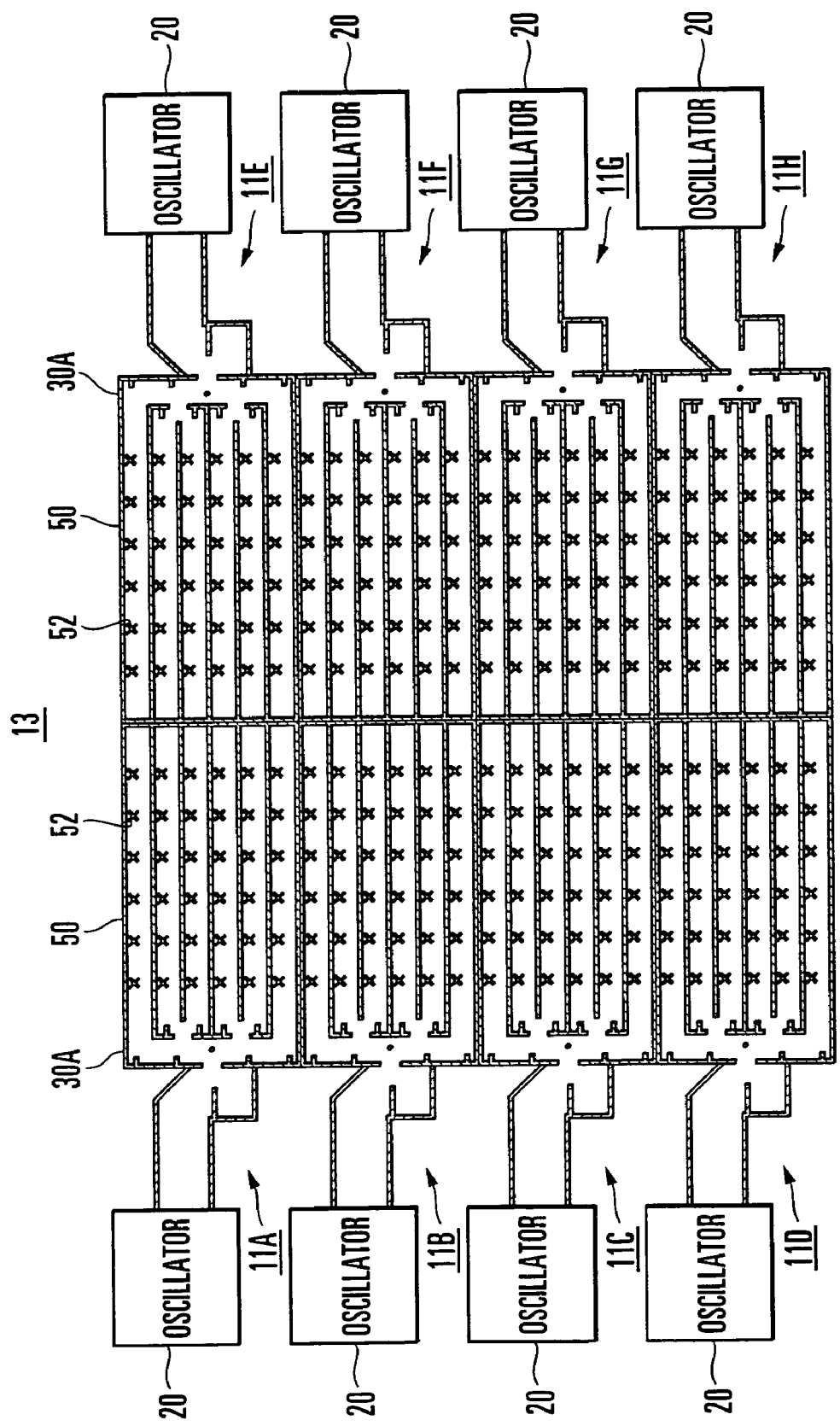
FIG. 8 is a cross-sectional view showing the arrangement of a microwave supply device according to the fourth embodiment.

FIG. 8 is a cross-sectional view showing the arrangement of a microwave supply device according to the fourth embodiment of the present invention. This microwave supply device 13 is formed by combining a plurality of microwave supply devices 11 according to the second embodiment. More specifically, the microwave supply device 13 comprises eight microwave supply devices 11A, 11B, 11C, 11D, 11E, 11F, 11G, and 11H. The microwave supply devices 11A to 11H are arranged such that their surfaces (wide walls of the radiation waveguides 51A to 51F) where radiation slots 52 of respective antenna assemblies 50 are formed form one flat surface. In the example shown in FIG. 8, the microwave supply devices 11A to 11D are arranged such that side walls 64 and 66 of their antenna assemblies 50 oppose each other. This also applies to the microwave supply devices 11E to 11H. The microwave supply devices 11A and 11E are arranged such that side walls 65 of their antenna assemblies 50 oppose each other. This also applies to the microwave supply devices 11B and 11F, 11C and 11G, and 11D and 11H.

As in this embodiment, when power is supplied into the processing vessel 1 using the plurality of microwave supply devices 11A to 11H, power supply equivalent to that achieved by using a single high-output oscillator can be realized using a plurality of low-output oscillators. Even when large power must be supplied to the processing vessel 1, as in a case of performing a plasma process using a large-diameter processing vessel 1, if a plurality of low-output, inexpensive microwave oscillators 20 are employed, the manufacturing cost of the entire plasma processing system can be decreased.

In this embodiment, the plurality of microwave supply devices 11 according to the second embodiment are combined. Alternatively, a plurality of microwave supply devices 10, 12, or 14 according to another embodiment may be combined.

Fifth Embodiment

Figure 9:
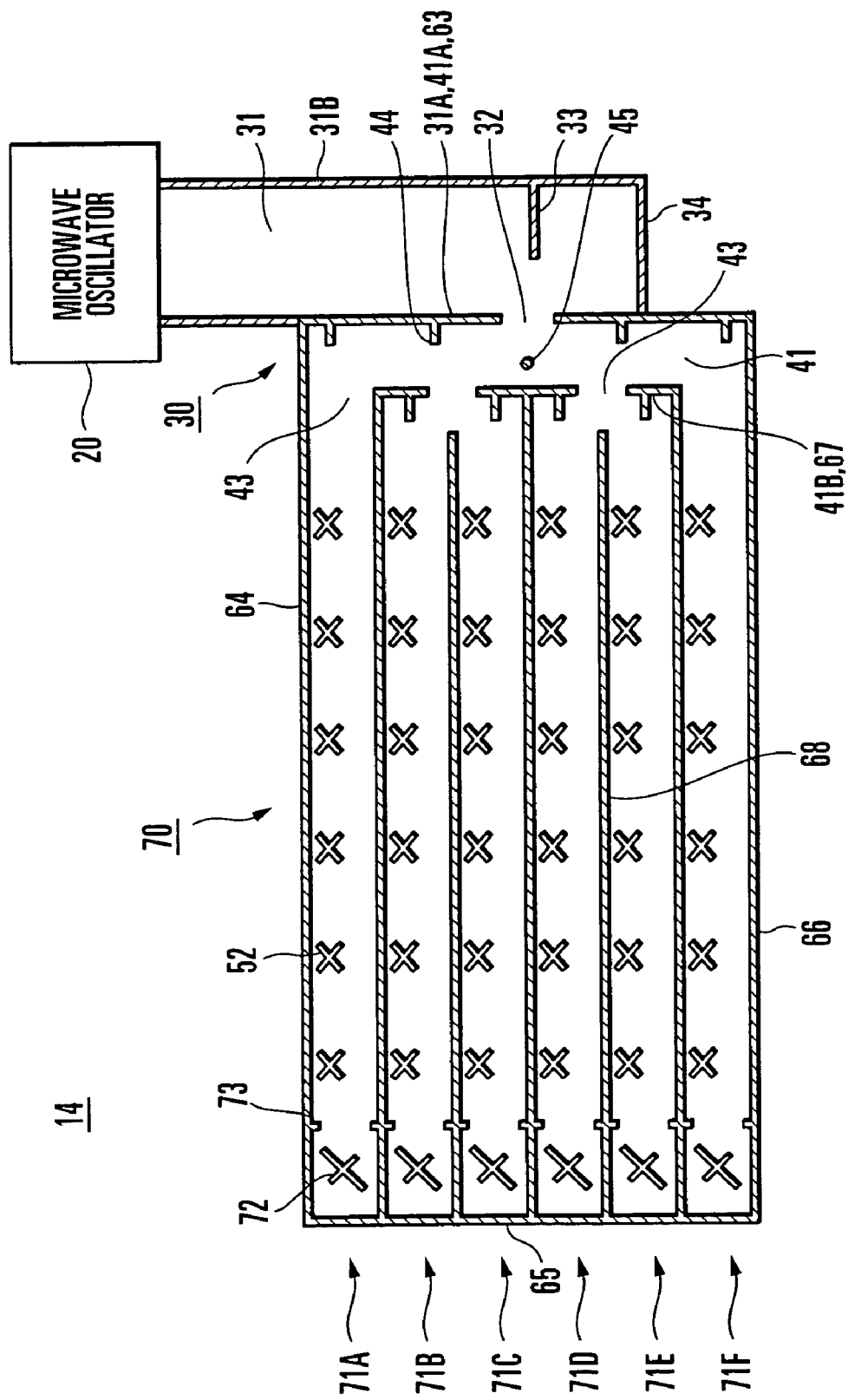
FIG. 9 is a cross-sectional view showing the arrangement of a microwave supply device according to the fifth embodiment.

FIG. 9 is a cross-sectional view showing the arrangement of a microwave supply device according to the fifth embodiment of the present invention. An antenna assembly 70 of this microwave supply device 14 has radiation waveguides 71A to 71F similar to the radiation waveguides 51A to 51F of the first embodiment. In the following description, the radiation waveguides 71A to 71F will be represented by a radiation waveguide 71.

Figure 10:
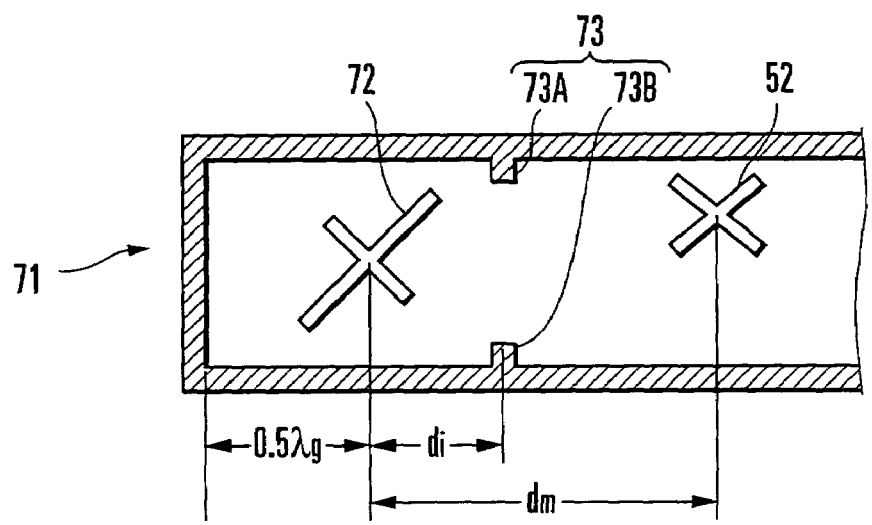
FIG. 10 is an enlarged view of the terminal end and its vicinity of a radiation microwave.

FIG. 10 is an enlarged view of the terminal end and its vicinity of the radiation waveguide 71. The radiation waveguide 71 has a standing wave driving slot 72 in the terminal end side of its wide wall where radiation slots 52 are formed. The standing wave driving slot 72 is a slot which is driven by standing waves formed of traveling waves traveling from the input end to the terminal end of the radiation waveguide 71, and reflected waves reflected by the terminal end toward the input end side. Hence, desirably, the standing wave driving slot 72 is arranged at a position where the amplitude of the standing waves becomes maximum, i.e., a position away from the terminal end by about a natural number multiple of substantially ½ a tube wavelength $\lambda_g$. According to this embodiment, the standing wave driving slot 72 is arranged at a position substantially $\lambda_g/2$ from the terminal end. Also, according to the present invention, a cross slot is employed as the standing wave driving slot 72.

When the standing wave driving slot 72 is formed, the reflected waves reflected by the terminal end of the radiation waveguide 71 are radiated externally to decrease the reflected waves that travel in the opposite direction in the tube. Consequently, the radiation slots 52 which are to be driven by the traveling waves operate as designed. Thus, the microwaves propagating in the radiation waveguide 71 can be supplied into a processing vessel 1 efficiently through the radiation slots 52, so a process utilizing the plasma generated by the microwaves can be performed efficiently.

With only the standing wave driving slot 72, however, circular polarized waves cannot be radiated from the radiation slots 52 toward the front surface (a direction normal to the wide wall where the radiation slots 52 are formed). This may be because the standing wave driving slot 72 does not decrease the reflected waves sufficiently. In view of this, according to this embodiment, a reflection member 73 which reflects part of the traveling waves toward the input end side is arranged between the standing wave driving slot 72 and its adjacent radiation slot 52. The reflection member 73 is formed of two reflection walls 73A and 73B which project perpendicularly from the respective narrow walls of the radiation waveguide 71. The reflection walls 73A and 73B extend between the upper and lower wide walls of the radiation waveguide 71. When the reflection walls 73A and 73B are arranged at appropriate positions between the center position of the standing wave driving slot 72 and a position away from the center position toward the input end side by substantially about $\lambda_g$ and the projecting lengths of the reflection walls 73A and 73B are adjusted, the reflected waves which are reflected by the reflection walls 73A and 73B can cancel the reflected waves which are reflected by the terminal end of the radiation waveguide 71 or the standing wave driving slot 72.

Numerical analysis was conducted on this embodiment. The result of the numerical analysis will be indicated. As the standing wave driving slot 72, a cross slot formed by perpendicularly crossing two slots, respectively having lengths of $0.286\lambda_0$ and $0.376\lambda_0$ ($\lambda_0$: free space wavelength), at their centers was used. A relative dielectric constant $\in_r$ inside and outside the radiation waveguide 71 was set to 3.5. If no reflection walls 73A and 73B were arranged, reflection of $-10$ dB was present at a frequency of 2.45 GHz. In contrast to this, if reflection walls 73A and 73B were arranged at positions away from the standing wave driving slot 72 by a distance $d_1=0.134\lambda_0$, the reflection was decreased to $-30$ dB or less. If a distance $d_m$ between the standing wave driving slot 72 and its adjacent radiation slot 52 was set to $0.855\lambda_g$, circular polarized waves could be radiated toward the front surface. Note that the circular polarized waves had an axial ratio of $-2.14$ dB and a reflection coefficient of 27.4 dB.

In this manner, when the reflection walls 73A and 73B are arranged, the microwaves can be radiated from the radiation slots 52 toward the front surface. Namely, the antenna assembly 70 can radiate microwaves toward the stage 2. As a result, a plasma is generated immediately above the stage 2. Thus, the plasma processing system can be designed easily.

The invention claimed is:

1. A distributor comprising:
   an oscillator which outputs electromagnetic waves;
   a first square waveguide to be connected to said oscillator;
   a second square waveguide having a plurality of openings; and
   a plurality of radiation waveguides arrayed in a widthwise direction perpendicular to tube axes,
   wherein said first square waveguide and said second square waveguide communicate with each other through a communication hole formed in a first narrow wall of each of said first square waveguide and said second square waveguide,
   wherein said second square waveguide communicates with radiation waveguides through the plurality of openings,
   wherein said first square waveguide comprises a first guide wall which projects from a second narrow wall toward the communication hole and guides the electromagnetic waves propagating in said first square waveguide toward the communication hole, and
   wherein electromagnetic waves reflected by said first guide wall that travel in an opposite direction in said first square waveguide cancel the electromagnetic waves which are reflected by an end of said first square waveguide.

2. A distributor according to claim 1, wherein said second square waveguide comprises a plurality of second guide walls which project from the first narrow wall of the second square waveguide toward each of the plurality of openings.

3. A distributor according to claim 1, wherein
said first guide wall is arranged to oppose the communication hole, and
said end of said first square waveguide is arranged at a position away from said first guide wall by an integer multiple of substantially ½ a tube wavelength of said first square waveguide.

4. A distributor according to claim 1, wherein said second square waveguide comprises a conductive column which is arranged in the vicinity of the communication hole and extends between opposing wide walls.

5. A distributor according to claim 1, wherein said first square waveguide and said second square waveguide have different relative dielectric constants.

6. A distributor according to claim 1, wherein said second square waveguide is disposed in parallel with said first square waveguide.

7. A distributor according to claim 1, wherein said first narrow wall of each of said first and said second waveguides is in parallel with an axis of each of said first and second square waveguides.

8. A plasma processing system comprising:
a stage to place a target object thereon;
a processing vessel to accommodate said stage;
an antenna assembly having a plurality of radiation waveguides with slots; and
a distributor which distributes electromagnetic waves to said radiation waveguides,
wherein said radiation waveguides are arrayed in a widthwise direction perpendicular to tube axes with respect to said processing vessel,
said distributor comprises
an oscillator which outputs the electromagnetic waves,
a first square waveguide to be connected to said oscillator, and
a second square wave guide to be connected to one end of each of said radiation waveguides through a plurality of openings formed therein,
wherein said first square waveguide and said second square waveguide communicate with each other through a communication hole formed in a first narrow wall of each of said first square waveguide and said second square waveguide,
wherein said first square waveguide comprises a first guide wall which projects from a second narrow wall toward the communication hole and guides the electromagnetic waves propagating in said first square waveguide toward the communication hole,
wherein said second square waveguide comprises a plurality of second guide walls which project from said first narrow wall of the second square waveguide toward each of the plurality of openings, and
wherein electromagnetic waves reflected by said first guide wall that travel in an opposite direction in said first square waveguide cancels the electromagnetic waves which are reflected by an end of said first square waveguide.

9. A plasma processing system according to claim 8, wherein each of said radiation wave guides has a standing wave driving slot, on the other end of a side wall thereof, to be driven by standing waves which are formed of traveling waves traveling from said one end toward said other end and reflected waves reflected by said other end toward said one end.

10. A plasma processing apparatus according to claim 8, further comprising a plurality of oscillators.

11. A plasma processing apparatus according to claim 8, further comprising a plurality of microwave supply devices including said antenna assembly and said distributor.

12. A plasma processing apparatus according to claim 11, wherein in two of the microwave supply devices, the other end of one of said radiation waveguides opposes that of the other of said radiation waveguides, and said oscillators interpose said radiation waveguides and are located on opposite sides.

13. A plasma processing system according to claim 9, wherein said standing wave driving slot is formed at a position away from said other end toward said one end by a natural number multiple of substantially ½ a tube wavelength of a corresponding one of said radiation waveguides.

14. A plasma processing system according to claim 9, wherein each of said radiation waveguides comprises a reflecting member which is arranged on a side of said one end, when seen from said standing wave driving slot, and reflects part of the traveling waves toward said one end to cancel the reflected waves which are reflected by said other end or said standing wave driving slot.

15. A plasma processing system according to claim 14, wherein said reflecting member is arranged at a predetermined position between a center position of said standing wave driving slot and a position away from the center position toward said one end by substantially ⅜ the tube wavelength of said corresponding one of said radiation waveguides.

16. A distributing method comprising:
a first step of introducing electromagnetic waves propagating in a first square waveguide into a second square waveguide through a communication hole formed in a first narrow wall of each of the first square waveguide and the second square waveguide; and
a second step of distributing the electromagnetic waves introduced into the second square waveguide to a plurality of radiation waveguides arrayed in a widthwise direction perpendicular to tube axes, through a plurality of openings formed in the second square waveguide,
wherein in the first step, the electromagnetic waves propagating in the first square waveguide are guided toward the communication hole by a guide wall which projects from a second narrow wall of the first square waveguide toward the communication hole, and
wherein electromagnetic waves reflected by said first guide wall that travel in an opposite direction in said first square waveguide cancels the electromagnetic waves which are reflected by an end of said first square wave guide.

17. A plasma processing method comprising:
a first step of introducing electromagnetic waves propagating in a first square waveguide into a second square waveguide through a communication hole formed in a first narrow wall of each of the first square waveguide and the second square waveguide;
a second step of distributing the electromagnetic waves introduced into the second square waveguide to a plurality of radiation waveguides arrayed in a widthwise direction perpendicular to tube axes, through a plurality of openings formed in the second square waveguide;

a third step of supplying the electromagnetic waves introduced into the radiation waveguides to a processing vessel through a slot formed in each of the radiation waveguides; and a fourth step of processing a target object placed in the processing vessel utilizing a plasma which is generated by the electromagnetic waves supplied to the processing vessel, wherein in the first step, the electromagnetic waves propagating in the first square waveguide are guided toward the communication hole by a first guide wall which projects from a second narrow wall of the first square wave guide toward the communication hole, wherein in the second step, the electromagnetic waves propagating in the second square waveguide are guided toward the opening by a plurality of second guide walls which project from said first narrow wall of the second square waveguide toward each of the plurality of openings, and wherein electromagnetic waves reflected by said first guide wall that travel in an opposite direction in said first square waveguide cancels the electromagnetic waves which are reflected by an end of said first square waveguide.

18. A process for fabricating an LCD, comprising:

a first step of introducing electromagnetic waves propagating in a first square waveguide into a second square waveguide through a communication hole formed in a first narrow wall of each of the first square waveguide and the second square waveguide;

a second step of distributing the electromagnetic waves introduced into the second square waveguide to a plurality of radiation waveguides arrayed in a widthwise direction perpendicular to tube axes, through a plurality of openings formed in the second square waveguide;

a third step of supplying the electromagnetic waves introduced into the radiation waveguides to a processing vessel through a slot formed in each of the radiation waveguides; and a fourth step of subjecting a surface of an LCD substrate arranged in the processing vessel to a process such as etching, ashing, oxidation, nitridation, or CVD utilizing a plasma which is generated by the electromagnetic waves supplied to the processing vessel, wherein in the first step, the electromagnetic waves propagating in the first square waveguide are guided toward the communication hole by a first guide wall which projects from a second narrow wall of the first square waveguide toward the communication hole, wherein in the second step, the electromagnetic waves propagating in the second square waveguide are guided toward the opening by a plurality of second guide walls which project from said first narrow wall of the second square waveguide toward each of the plurality of openings, and wherein electromagnetic waves reflected by said first guide wall that travel in an opposite direction in said first square waveguide cancels the electromagnetic waves which are reflected by an end of said first square waveguide.

* * * * *